US007037736B2

(12) United States Patent
Chavarria et al.

(10) Patent No.: US 7,037,736 B2
(45) Date of Patent: May 2, 2006

(54) FLUID EJECTION DEVICE

(75) Inventors: Victorio A. Chavarria, Corvallis, OR (US); Sadiq S. Bengali, Corvallis, OR (US); Ronald L. Enck, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 140 days.

(21) Appl. No.: 10/436,921

(22) Filed: May 13, 2003

(65) Prior Publication Data

US 2004/0017427 A1 Jan. 29, 2004

Related U.S. Application Data

(62) Division of application No. 09/814,283, filed on Mar. 21, 2001, now Pat. No. 6,582,063.

(51) Int. Cl.
*H01L 21/00* (2006.01)

(52) U.S. Cl. ........................................................ 438/21

(58) Field of Classification Search .................. 438/21, 438/689
See application file for complete search history.

(56) References Cited

U.S. PATENT DOCUMENTS

| | | | | |
|---|---|---|---|---|
| 5,063,655 | A * | 11/1991 | Lamey et al. | 438/21 |
| 5,943,076 | A * | 8/1999 | Burke et al. | 347/64 |
| 6,632,710 | B1 * | 10/2003 | Takahashi | 438/149 |
| 2002/0130371 | A1 * | 9/2002 | Bryant et al. | 257/379 |

* cited by examiner

*Primary Examiner*—David Nelms
*Assistant Examiner*—Quoc Hoang

(57) ABSTRACT

The present invention includes as one embodiment a method for fabricating a portion of an ink-jet printhead made of a silicon substrate, the method including selectively etching active region contact vias of a field effect transistor that has a conducting channel that is insulated from a gate terminal by a layer of oxide along with separate substrate contact vias using a single mask and forming the substrate contact vias simultaneously with the active region contact vias during the selective etching.

6 Claims, 13 Drawing Sheets

FLUID EJECTION DEVICE

CROSS REFERENCE TO RELATED APPLICATION

This is a divisional of application Ser. No. 09/814,283 filed on Mar. 21, 2001, now U.S. Pat. No. 6,582,063 which is hereby incorporated by reference herein.

STATEMENT REGARDING FEDERALLY SPONSORED RESEARCH OR DEVELOPMENT

Not Applicable.

REFERENCE TO AN APPENDIX

Not Applicable.

BACKGROUND OF THE INVENTION

1. Field of the Invention

The present invention relates generally to thin film processes, more specifically to thin film processes for the fabrication of ink-jet printhead structures, and particularly an improved method for fabrication of thermal ink-jet printhead drop generator arrays and an ink-jet printhead fabricated in accordance with the method.

2. Description of Related Art

The art of ink-jet technology is relatively well developed. Commercial products such as computer printers, graphics plotters, copiers, and facsimile machines employ ink-jet technology for producing hard copy. The basics of this technology are disclosed, for example, in various articles in the *Hewlett-Packard Journal*, Vol. 36, No. 5 (May 1985), Vol. 39, No. 4 (August 1988), Vol. 39, No. 5 (October 1988), Vol. 43, No. 4 (August 1992), Vol. 43, No. 6 (December 1992) and Vol. 45, No.1 (February 1994) editions. Ink-jet devices are also described by W. J. Lloyd and H. T. Taub in *Output Hardcopy [sic] Devices*, chapter 13 (Ed. R. C. Durbeck and S. Sherr, Academic Press, San Diego, 1988).

A simplistic schematic of a swath-scanning ink-jet pen 100 is shown in FIG. 1 (PRIOR ART). The body of the pen 101 generally contains an ink accumulator and regulator mechanism 102. The internal ink accumulator—or ink accumulation chamber—and associated regulator 102 are fluidically coupled 103 to an off-axis ink reservoir (not shown) in a known manner common to the state of the art. The printhead 104 element includes appropriate electrical connectors 105 (such as a tape automated bonding, "flex tape") for transmitting signals to and from the printhead. Columns of individual nozzles 106 form an addressable firing array 107. The typical state of the art scanning pen printhead may have two or more columns with more than one-hundred nozzles per column. The nozzle array 107 is usually subdivided into discrete subsets, known as "primitives," which are dedicated to firing droplets of specific colorants on demand. In a thermal ink-jet pen, an ink drop generator mechanism includes a heater resistor subjacent each nozzle 106 with an ink chamber therebetween. Selectively passing current through a resistor superheats ink to a cavitation point such that an ink bubble's expansion and collapse ejects a droplet from the associated nozzle 106.

Prior art for printhead structures and fabrication is typified by patents to Keefe et al., assigned to the common assignee herein. U.S. Pat. No. 5,278,584 shows an IMPROVED INK DELIVERY SYSTEM FOR AN INK-JET PRINTHEAD. U.S. Pat. No. 5,635,966, a continuation in part of the Keefe '584 patent, shows an EDGE FEED INK DELIVERY THERMAL INKJET PRINTHEAD STRUCTURE AND METHOD OF FABRICATION.

The ever increasing complexity and miniaturization of TIJ nozzle arrays has led to the use of silicon wafer integrated circuit technology for the fabrication of printhead structures. For the purpose of the present invention, the "frontside" of a silicon wafer, or wafer printhead die region, is that side having drop generator elements; the "backside" of a silicon wafer, or wafer printhead die region, is the opposite planar side, having ink feed channels (also referred to simply as "trenches") fluidically coupled by ink feed holes through the silicon wafer to the drop generator elements. It is generally desirable in any integrated circuit (IC) thin film process to minimize masking steps to reduce cost and complexity.

FIG. 2 (PRIOR ART) is an illustration of a highly magnified cross-section of a thermal ink-jet printhead structure 200. It should be recognized that these illustrations are schematics for a very small region of a silicon wafer which may be many orders of magnitude greater in dimension to the shown die region. Many publications describe the details of common techniques used in the fabrication of complex, three-dimensional, silicon wafer based structures; see e.g., *Silicon Processes*, Vol. 1–3, copyright 1995, Lattice Press, Lattice Semiconductor Corporation (assignee herein), Hillsboro, Oreg. Moreover, the individual steps of such a process can be performed using commercially available fabrication machines. The use of such machines and common fabrication step techniques will be referred to hereinafter as simply: "in a known manner." As specifically helpful to an understanding of the present invention, approximate technical data are disclosed herein based upon current technology; future developments in this art may call for appropriate adjustments as would be apparent to one skilled in the art.

Historically, the thin film process for forming such a structure 200 consisted of a nine mask process, four for transistor(s) formation and five for ink drop generator(s) formation. In order for the transistor formation are the active region mask, the polysilicon mask, the contact mask, and the substrate contact mask. The "substrate contact" is used to ground the silicon and the body of the MOSFET devices.

An orifice plate 201 overlays a printhead barrier layer 203 in a manner such that ink 205 from a supply (not shown) accumulates in a drop firing chamber in a nozzle 106 (FIG. 1) superjacent a heater/firing resistor 207. An electrical contact lead 209, in this embodiment a layer of gold 209' superjacent a layer of tantalum 209", is connected via an aluminum/tantalum-aluminum trace 211 to a MOSFET 213 device formed in the surface of a silicon substrate 215. The MOSFET device 213 is coupled to the firing resistor 207 via another aluminum/tantalum-aluminum trace 211'. Control signals to the transistor 213 selectively turn such heater resistors on and off to eject ink drops from the array 107 (FIG. 1) in accordance with the digital date for dot matrix printing.

In forming the heater/firing resistor driver MOSFET 213 as shown in FIG. 2 the contacts and substrate contacts in the state of the art are formed by the steps shown in FIGS. 3A, 3B and 3C (PRIOR ART). FIG. 3A shows a cross-section depiction having a plurality of partial formed MOSFETS immediately after the contact etch step has been performed. Based on a superjacent photoresist mask layout of a third mask in the overall process, this contact etch step selectively removes phosphosilicate glass ("PSG") down into the source/drain down to the source/drain regions of the doped substrate so that in subsequent steps, when aluminum/tantalum-aluminum for the traces 211, 211', FIG. 2, is deposited, the metal is in contact with each source/drain region. The contact etch also makes a hole in the PSG over the substrate contacts, but the etch stops on the polysilicon 301. As demonstrated by FIGS. 3B and 3C, a separate photoresist mask 303 (fourth, or "substrate contact") must be used to etch the polysilicon and gate oxide to create a substrate contact, metal-to-silicon. In other words, note that substrate contacts require a special mask because the contacts have to go through an oxide, PSG, polysilicon, and gate oxide. Thus, it is important to note that the contact etch cannot be used by itself to make the substrate contacts because if the etch reaction is changed to also remove the polysilicon superjacent the substrate contact region, it would etch into the silicon in the source/drain contacts. At best, this would at least create unacceptable reliability problems during operation. At the worst it could make the device unusable, destroying wafer yield.

Thus, there is a need for an improved process for fabricating thermal ink-jet printheads.

BRIEF SUMMARY OF THE INVENTION

The present invention includes as one embodiment a method for fabricating a portion of an ink-jet printhead made of a silicon substrate, the method including selectively etching active region contact vias of a field effect transistor that has a conducting channel that is insulated from a gate terminal by a layer of oxide along with separate substrate contact vias using a single mask and forming the substrate contact vias simultaneously with the active region contact vias during the selective etching.

In its basic aspect, the present invention provides an ink-jet printhead fabrication method using a silicon wafer substrate, the method including: providing a single mask for etching of MOSFET active region contact vias and separate substrate contact vias; and simultaneously etching the MOSFET active region contact vias and the substrate contact vias using a selective etch wherein said the ratio of etch rate of silicon oxide:silicon is at least 10:1.

In another aspect, the present invention provides an ink-jet printhead including: a silicon wafer substrate; and substrate contacts for electrically grounding said substrate extending through device isolation oxide.

In still another aspect, the present invention provides an ink-jet pen including: an ink supply; and, fluidically coupled to the ink supply, a printhead, wherein said printhead includes a silicon wafer substrate and substrate contacts for electrically grounding said substrate extending through device isolation oxide of the printhead.

The foregoing summary is not intended to be an inclusive list of all the aspects, objects, advantages, and features of the present invention nor should any limitation on the scope of the invention be implied therefrom. This Summary is provided in accordance with the mandate of 37 C.F.R. 1.73 and M.P.E.P. 608.01 (d) merely to apprise the public, and more especially those interested in the particular art to which the invention relates, of the nature of the invention in order to be of assistance in aiding ready understanding of the patent in future searches. Objects, features and advantages of the present invention will become apparent upon consideration of the following explanation and the accompanying drawings, in which like reference designations represent like features throughout the drawings.

The drawings referred to in this specification should be understood as not being drawn to scale except if specifically annotated.

DETAILED DESCRIPTION OF THE INVENTION

Reference is made now in detail to a specific embodiment of the present invention, which illustrates the best mode presently contemplated by the inventors for practicing the invention. Alternative embodiments are also briefly described as applicable.

Figure 4A:
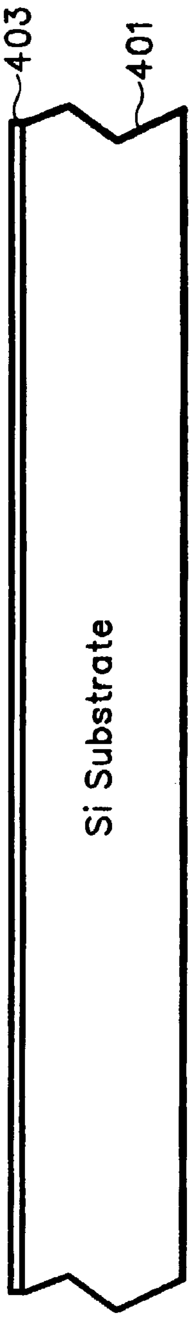
FIGS. 4A, 4B, 4C, 4D, 4E, 4F, 4G, 4H, 4I, 4J, 4K, 4M, 4N, 4O, 4P, 4Q and 4R are schematic illustrations in cross-section elevation view of a process steps in accordance with the present invention.

Referring now to FIGS. 4A, 4B, 4C, 4D, 4E, 4F, 4G, 4H, 41, 4J, 4K, 4M, 4N, 4O, 4P, 4Q and 4R, the process in accordance with the present invention is illustrated in a step-by-step format. FIG. 4A demonstrates a small cross-section of a commercially available silicon wafer 401. Starting with the bare silicon wafer 401, a thin layer of stress relief oxide ("SRO") 403 is grown using a known manner high temperature oxidation furnace. In the preferred embodiment, the SRO 403 layer is fundamentally pure glass (SiO2) and has a thickness of approximately six hundred Angstroms, 600D; an appropriate range would be from about 500D to about 700D.

Figure 4B:
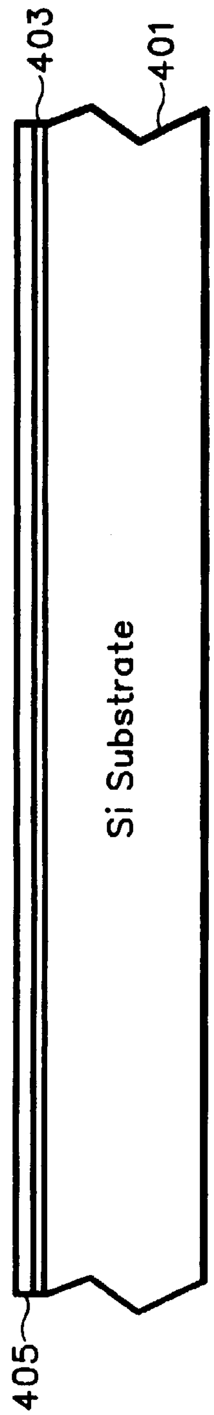

The SRO is used to relieve stress in the formation of a superjacent silicon nitride 405 layer as demonstrated by FIG. 4B. Silicon nitride ($Si_3N_4$) is deposited in a known manner low pressure chemical vapor deposition ("LPCVD") furnace. In the preferred embodiment, the silicon nitride 405 layer has a thickness of approximately 1200 Å; a range from approximately 1000 Å to approximately 1400 Å can be employed. The silicon nitride 405 will later serve as a masking layer for field oxide ($SiO_2$-"FOX") growth or shallow trench oxide formation.

Figure 4C:
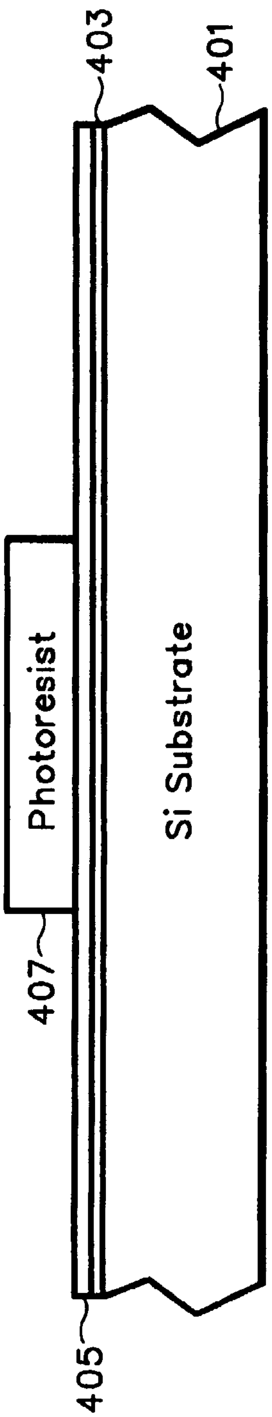

Turning to FIG. 4C, using known manner photolithography process, a layer of photoresist 407 is spun onto the silicon nitride 405 layer. The photoresist 407 is exposed and developed in accordance with a predetermined pattern for forming predetermined island locations (one shown) of the substrate 401 for subsequent active component formation steps. The patterned photoresist 407 layer is referred to as the "island mask."

Figure 1:
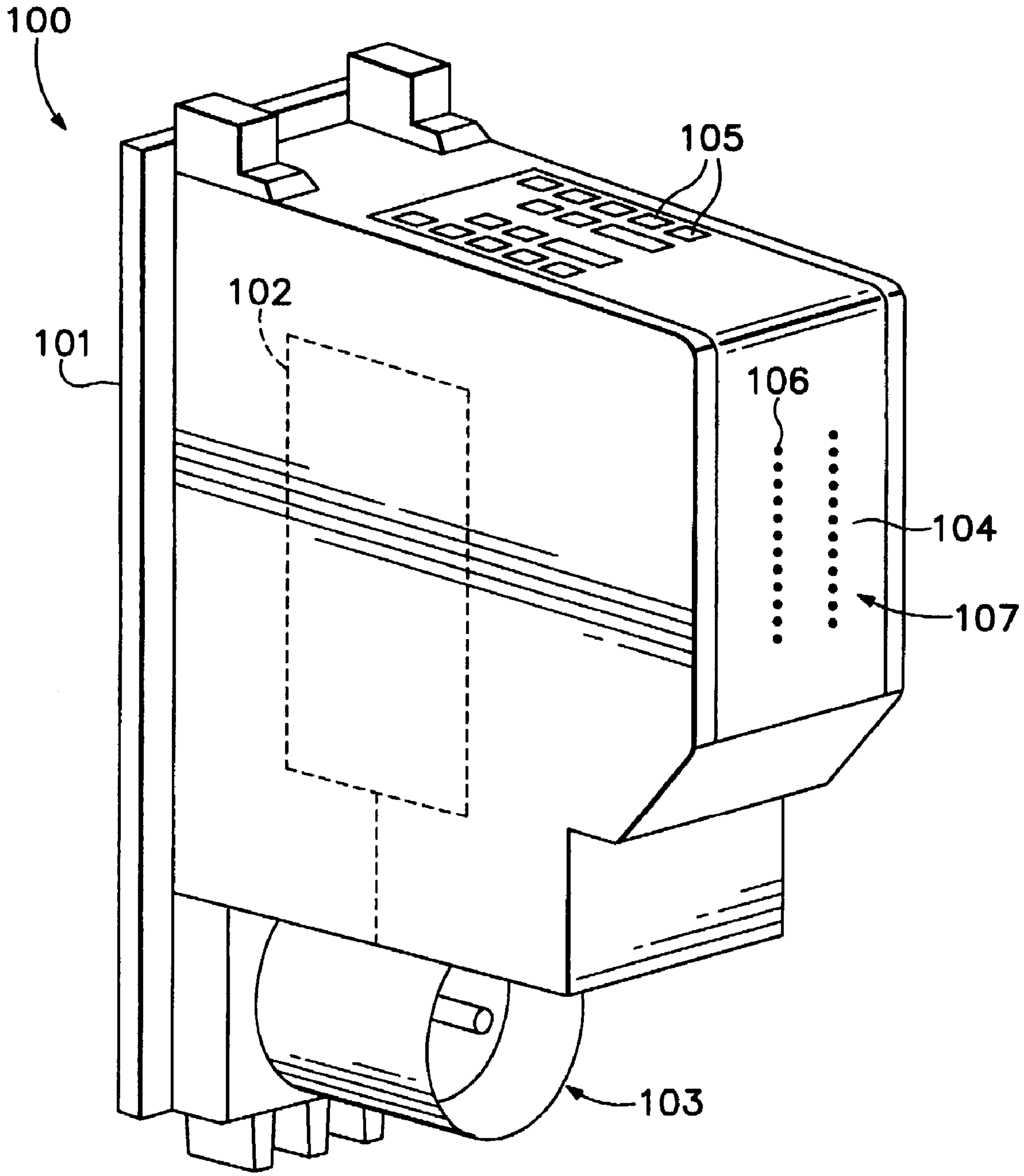
FIG. 1 (PRIOR ART) is a schematic illustration in perspective view of an ink-jet pen.
Figure 4D:
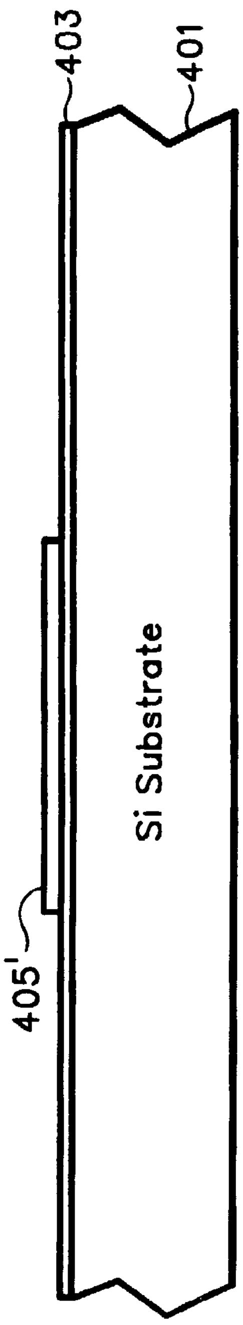

FIG. 4D shows the structure after a known manner dry etch process of the silicon nitride 405 layer and then and stripping of the island mask photoresist 407. The regions of the substrate 401 and SRO 403 subjacent the remaining silicon nitride 405' are thus still SiN masked where heater driver transistors can be formed later. This same, remaining SiN mask 405' layer forms a pattern in other regions across the structure surface to locate where heater/firing resistors will be formed later for the printhead array 107, FIG. 1.

Figure 4E:
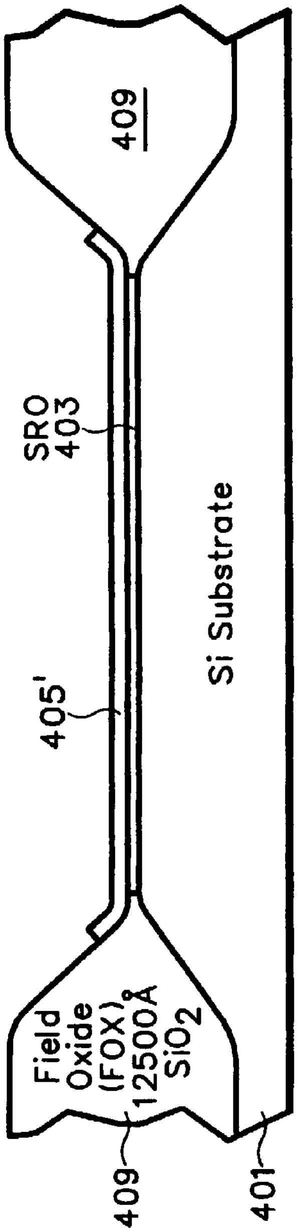

Turning to FIG. 4E, a thick FOX 409 is grown in a known manner, formed appropriately for isolating active devices (e.g., transistors to be formed) from each other using known manner processing and the silicon nitride mask 405'. The FOX 409 also is used for insulating the heater/firing resistor to be formed from the silicon substrate 401 (see e.g., FIG. 2). In the preferred embodiment, the FOX 409 has a thickness of approximately 12500 Å; a range from approximately 11,300 Å to approximately 13,700 Å can be employed.

Figure 4F:
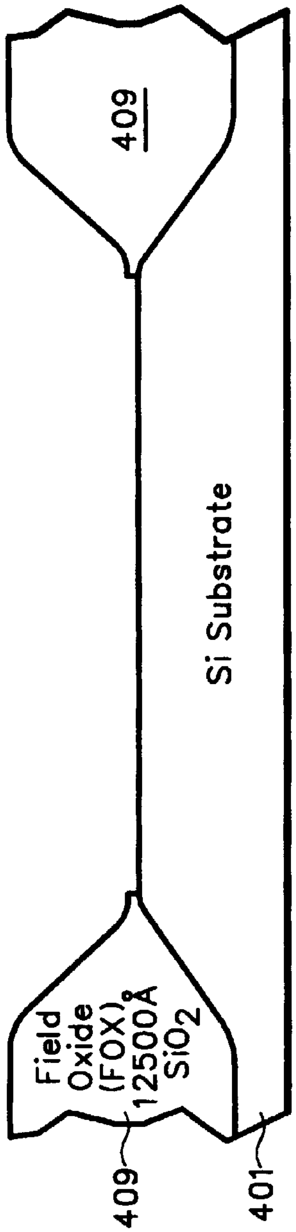
Figure 4G:
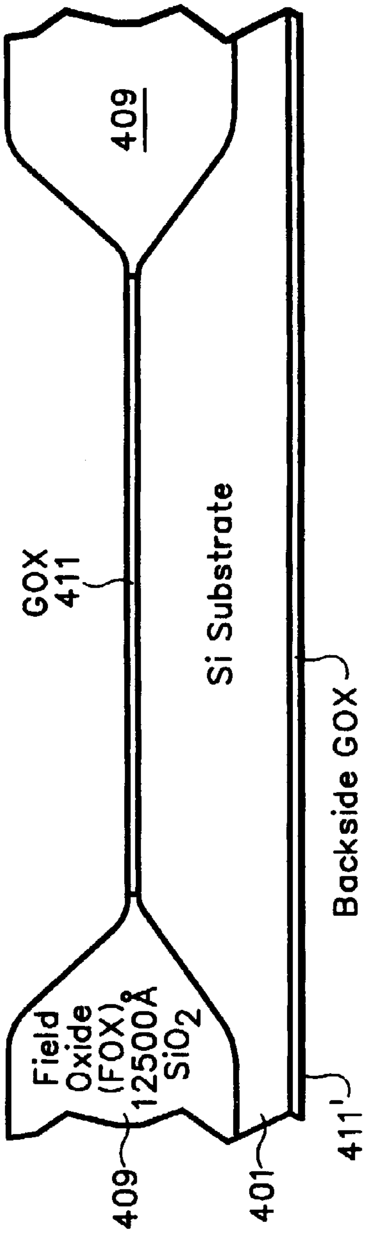

Turning to FIG. 4F, a known manner wet etch is preformed to remove the silicon nitride 405' and SRO 403 layers that formed the island mask. This exposes the surface of the silicon substrate 401 between the FOX 409 regions. Note that the FOX 409 will be slightly reduced in thickness by this step; a reduction of approximately 1250 Å reduction can be expected.

Figure 5:
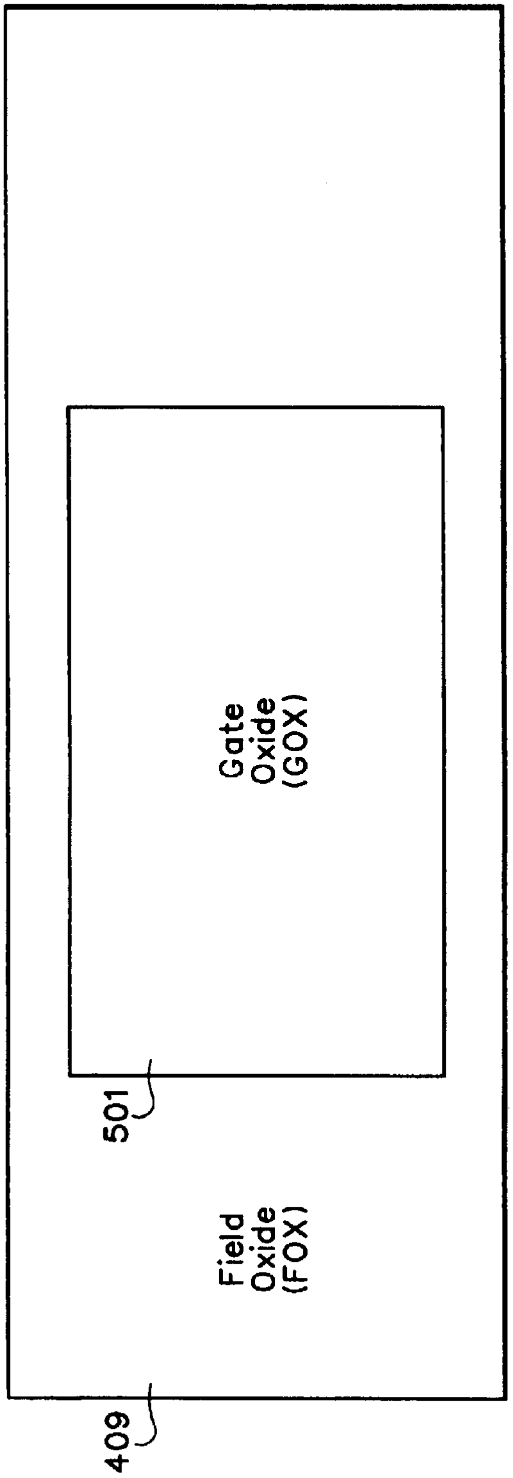
FIG. 5 is a top view representation of FIG. 4G.

The transistors to be formed are MOSFET types, requiring a dielectric gate oxide. In the next step, FIG. 4G, a relatively think gate oxide 411 ("GOX") is grown, covering the surface of the silicon substrate 401 and the backside of the wafer, backside GOX 411'. In the preferred embodiment, the GOX 411 layer has a thickness of approximately 1000 Å; a range from approximately 500 Å to approximately 1100 Å can be employed. Turning also now to FIG. 5, a top view shows the structure after the gate oxidation of FIG. 4G. Region 501 is the active device region. Region 503 is where substrate contacts will later be formed.

Figure 4H:
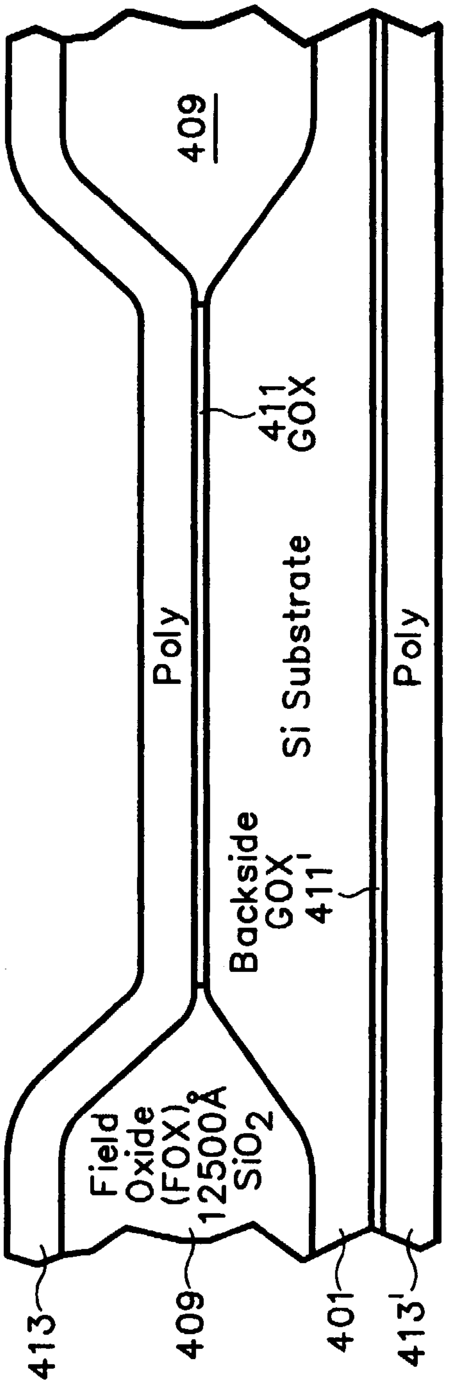

Turning to FIG. 4H, the next step is a deposition of polysilicon (Poly) 413, 413', again using an LPCVD furnace. Note that the Poly 413, 413' will cover the entire wafer, both frontside and backside.

Figure 4I:
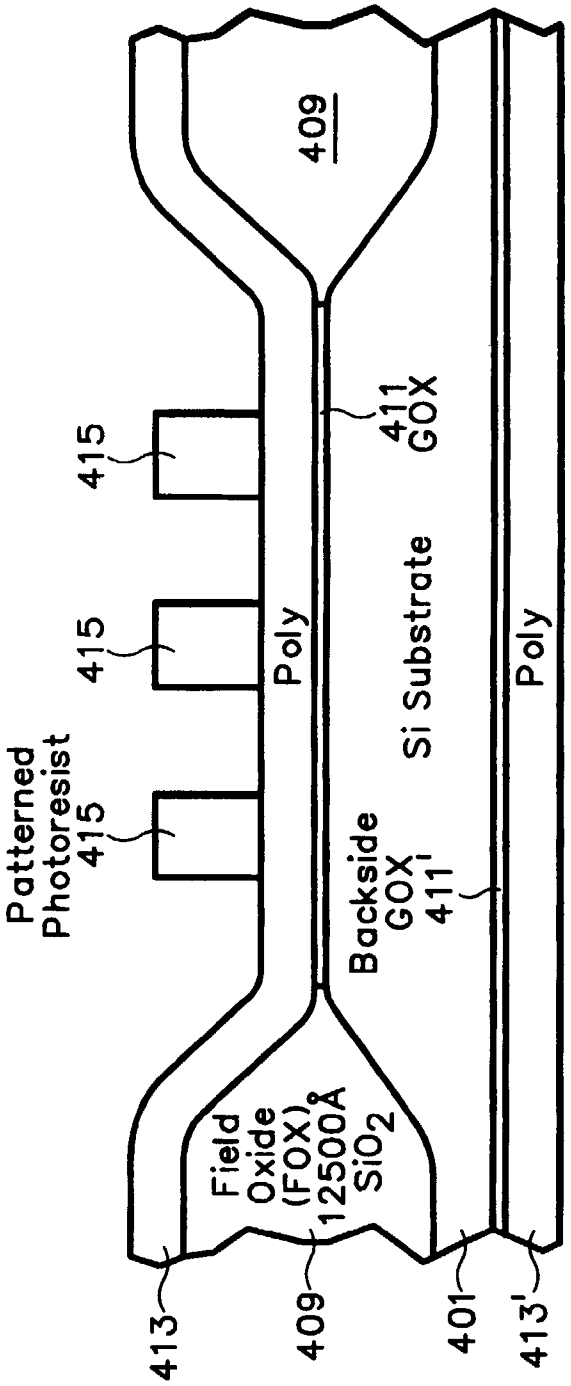

Photoresist 415 is again spun on and patterned as demonstrated by FIG. 4I. This forms a "gate mask" for the MOSFET devices to be formed subsequently.

Figure 4J:
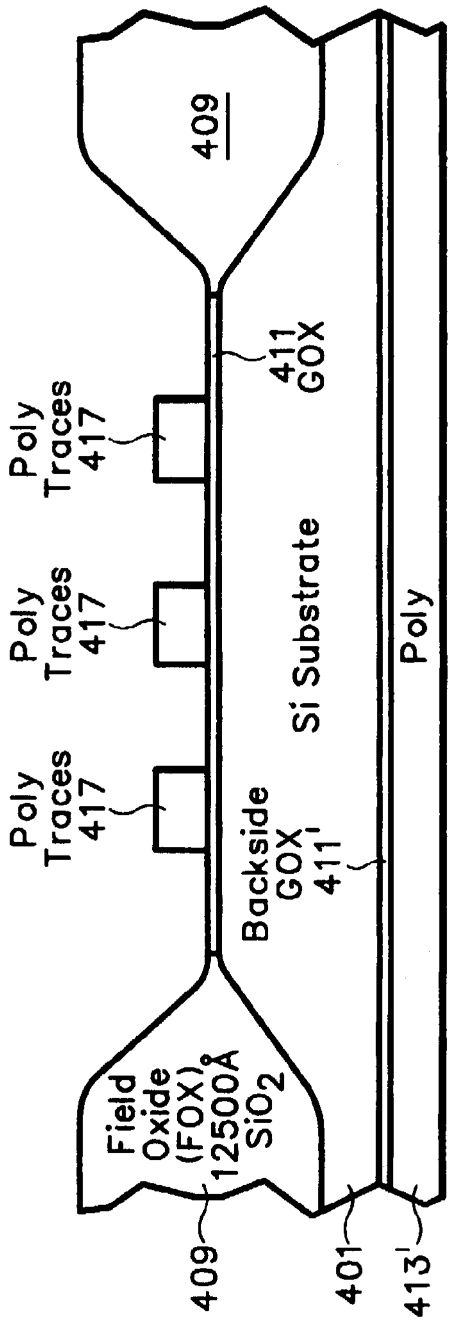
Figure 6:
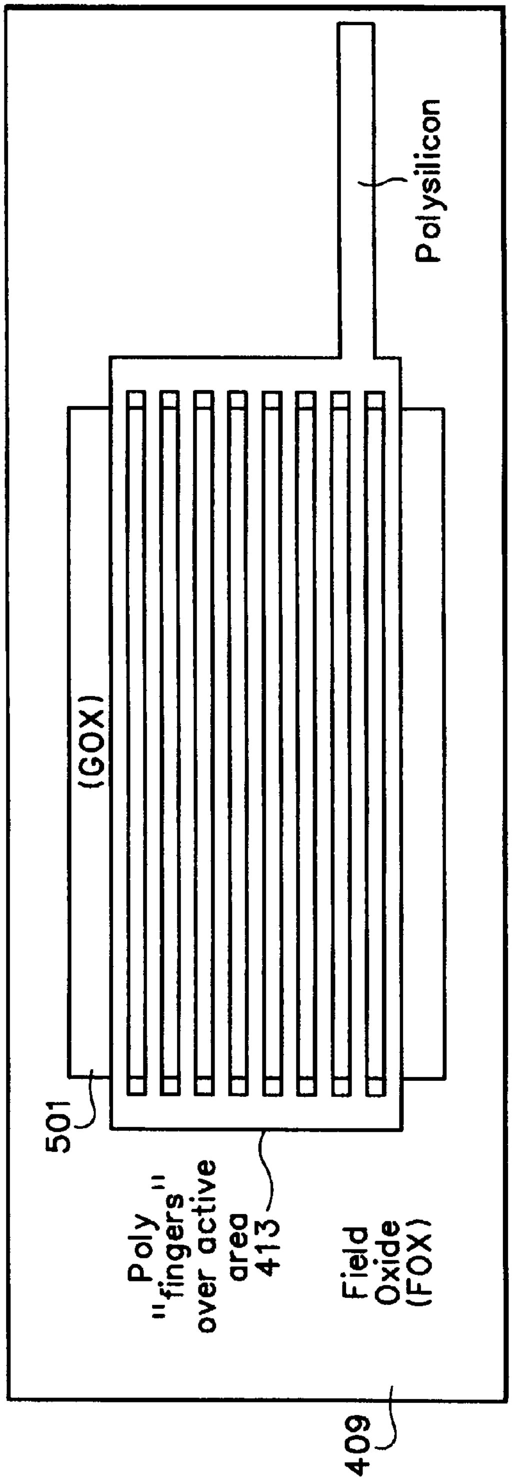
FIG. 6 is a top view representation of FIG. 4J.

Next, as illustrated in FIG. 4J, a known manner dry etch of the frontside Poly 413 layer is performed. Referring also to FIG. 6, a top view, after stripping the photoresist mask 415, polysilicon "fingers" traces 417 remain, which will serve as the electrical interconnect for the MOSFET gates and yet to be formed substrate contacts.

Figure 4K:
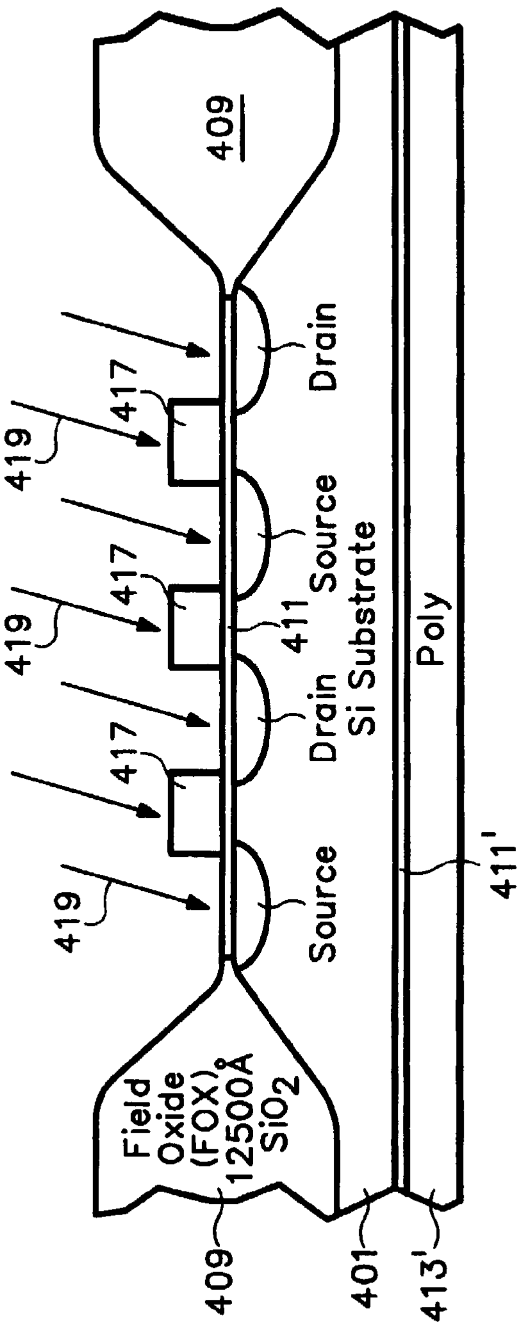

Demonstrated in FIG. 4K, using a known manner doping process, such as $POCL_3$ gas (n-type dopant) exposure or ion implant techniques represented by arrows 419, source and drain regions are formed in the frontside surface of the substrate 401 and dopes the Poly traces 417 to improve their electrical conductivity characteristic.

Figure 4M:
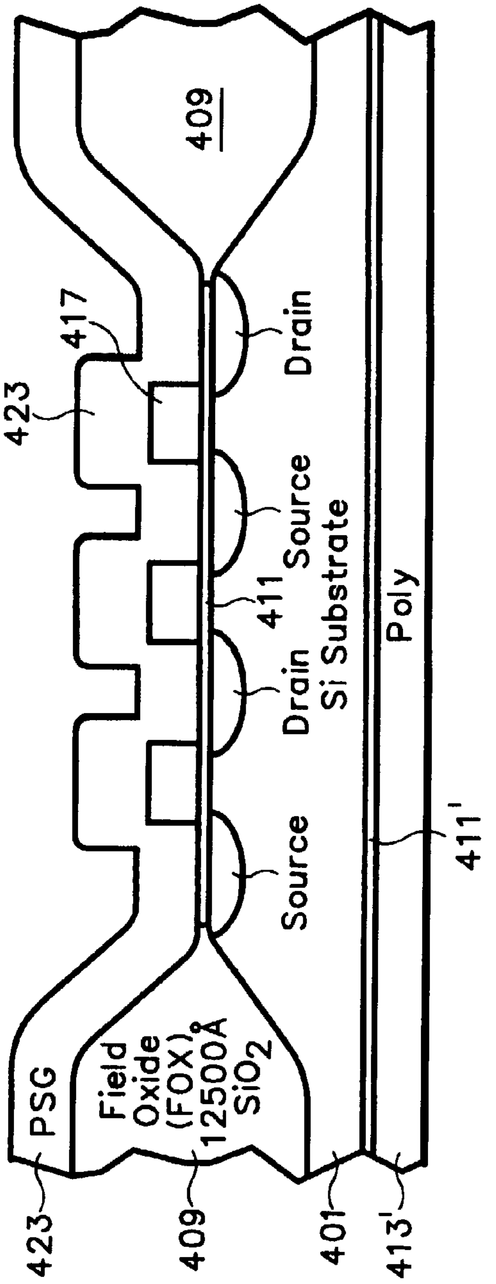

Using a known manner plasma environment chemical vapor deposition ("PECVD") reactor, a layer of PSG 423 is formed across the topside of the structure as depicted by FIG. 4M. The PSG 423 will serve as an electrical and thermal insulator as well as the final under-layer for each heater/firing resistor. In the preferred embodiment, the PSG is doped to contain about 8.7% phosphorous (p-type dopant); an approximate range of 8.2% to 9.2% may be employed.

Figure 4N:
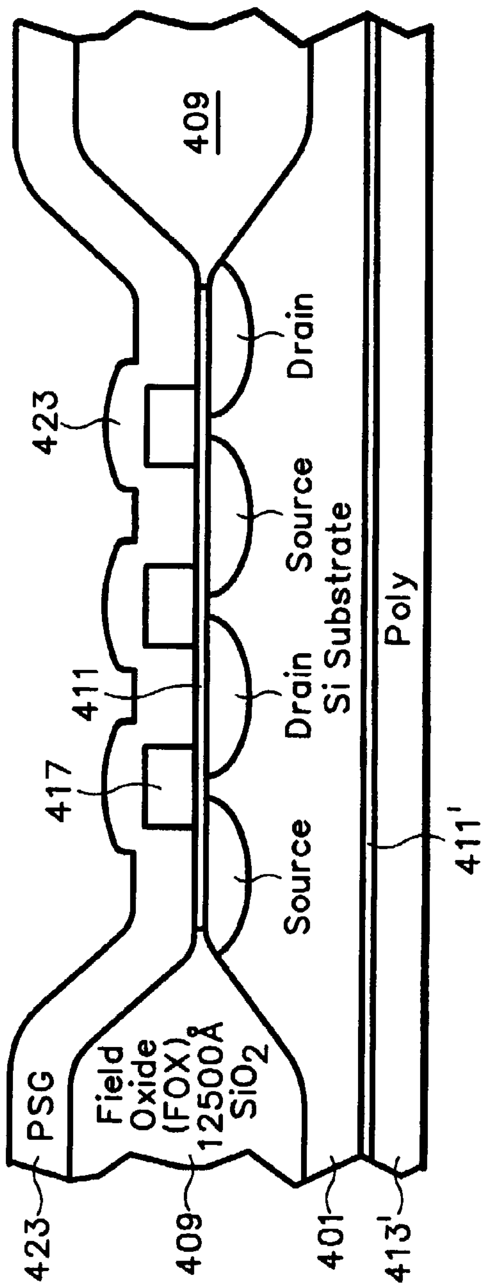

Turning now to FIG. 4N, in a known manner, a high-temperature furnace is used to densify and smooth the PSG 423, to stabilize its phosphorous dopant, and to diffuse the n-type dopant in the source/drain regions deeper into the silicon substrate 401.

Figure 4O:
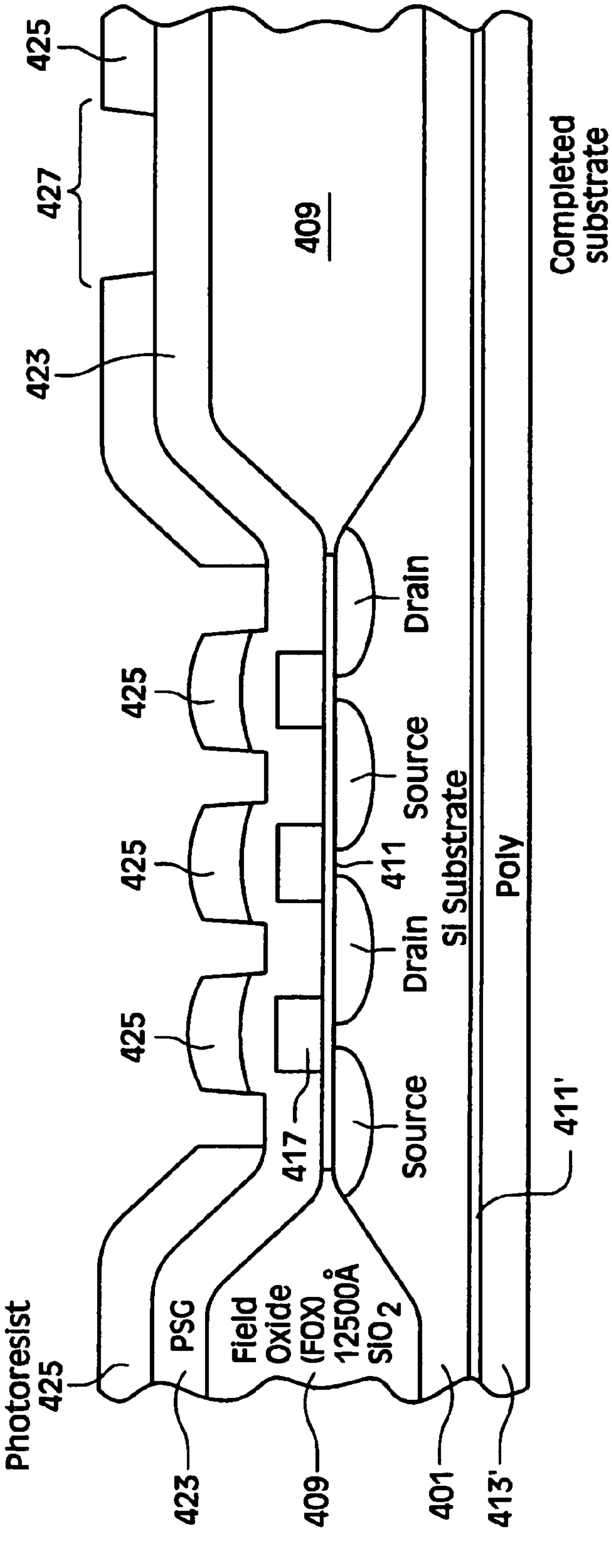

As illustrated in FIG. 4O, another, known manner, patterned, photoresist, source/drain "contact mask" 425 is formed. This same contact mask is used to define regions 427 where the substrate contacts are to be formed.

Figure 3A:
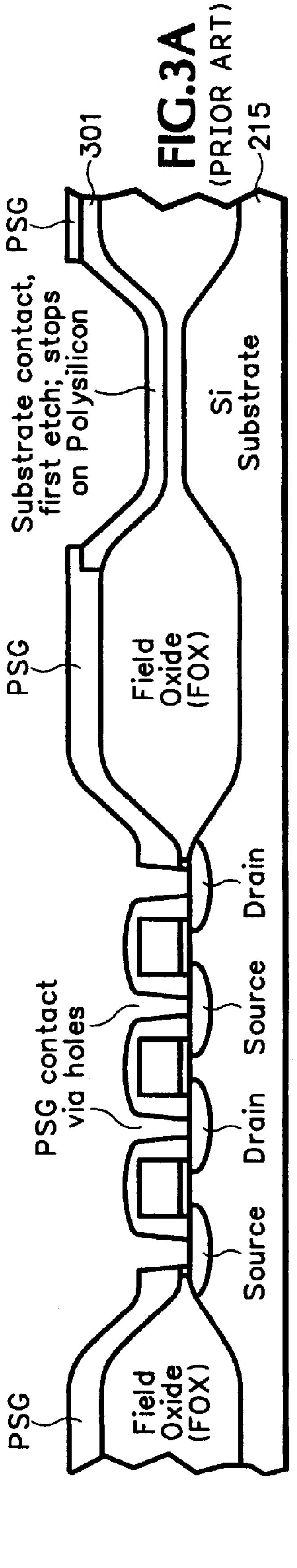
FIGS. 3A, 3B and 3C (PRIOR ART) are schematic illustrations in cross-section elevation view of steps of the process used in forming the printhead structure for the pen as shown in FIG. 1.
Figure 3B:
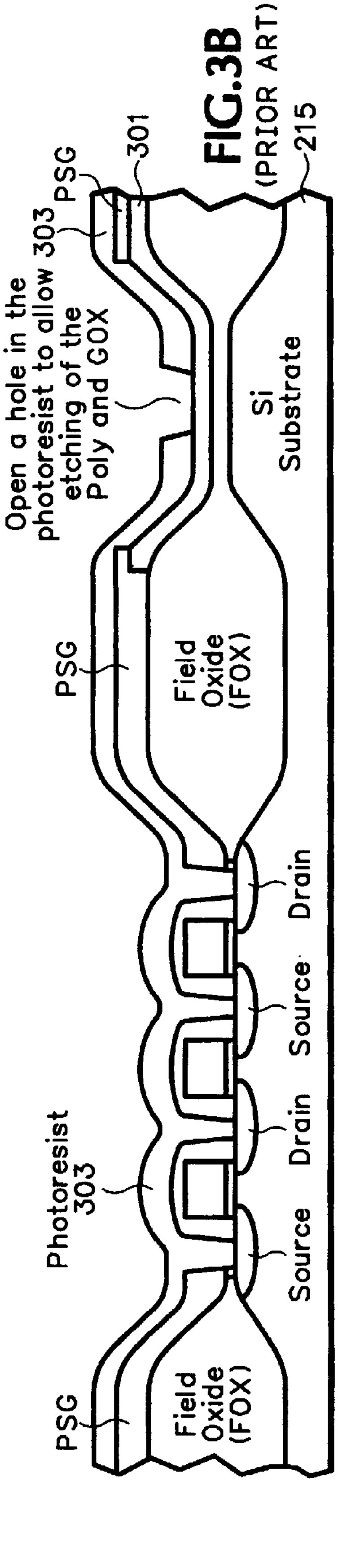
Figure 3C:
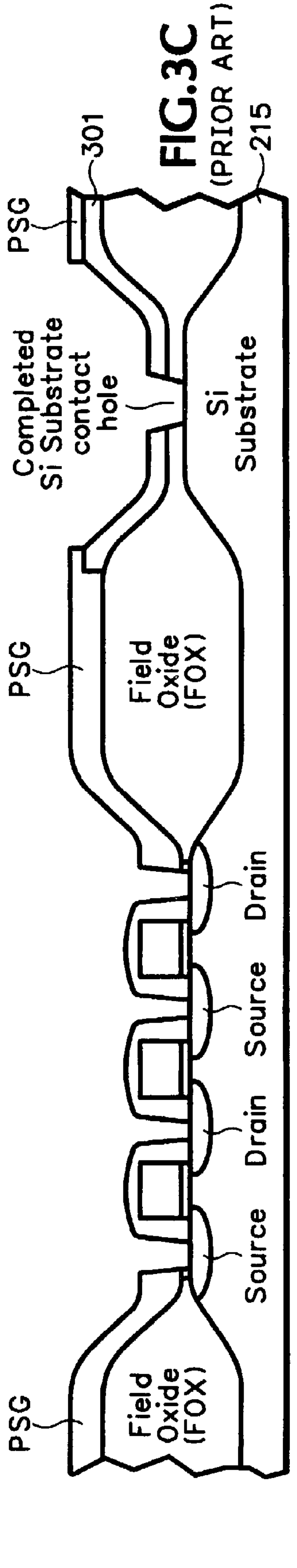
Figure 4P:
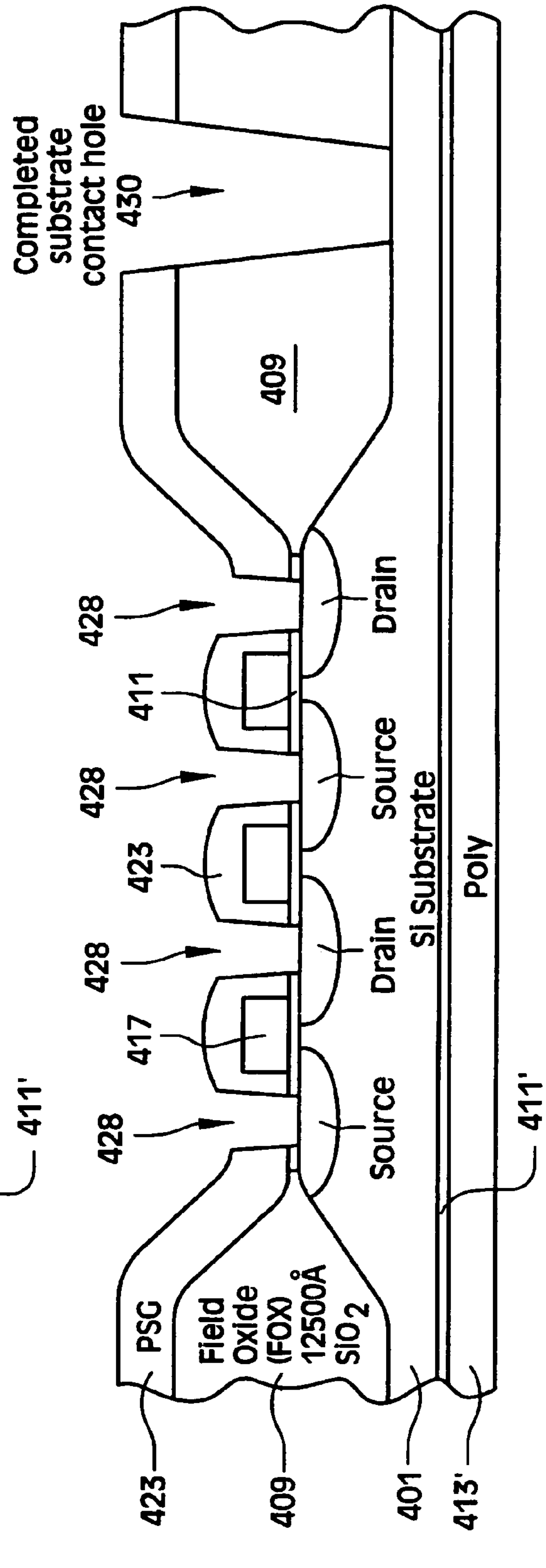

Now in the prior art, the next steps of the process would be that depicted in FIGS. 3A–3C. Instead, in accordance with the present invention, a dry etch of the PSG is performed but the process is selective and also etches through the FOX 409. The etch process is continued until substrate contact vias 430 to the silicon substrate 401 surface are fully formed as shown in FIG. 4P. The preferred parameters for this dry etch are:

Pressure: 600 milliTorr;
RF power: 900 Watts;
Electrode gap: 0.9 cm;
Argon flow: 250 sccm;
CF4 flow: 40 sccm;
CHF3 flow: 30 sccm; and
Time: 180 seconds.

The ratio of CHF3 to CF4 flow, e.g., approximately 3:4, is a critical parameter in determining silicon selectivity. A higher CHF3 flow improves selectivity but reduces the oxide etch rate. Selectivity is critical to the present invention. Since the silicon substrate surface in the source/drain contact region is exposed after etching the PSG, and GOX but the contact etch needs to go for a longer time in order to etch the FOX over the substrate contacts, it is essential that the contact etch not substantially etch the silicon substrate surface. The ratio of oxide etch:silicon etch should be at least 10:1. Commercially available etch chemicals have this characteristic. Thus, the substrate contact vias 430 are formed simultaneously with the MOSFET active region contact vias 428. In this manner, the present invention eliminates the need for the special masking and etching steps described with respect to FIGS. 3A–3C. The cost saving of eliminating the steps shown in FIGS. 3A–3C is substantial, advantageously reducing the cost of manufacture very significantly.

Figure 7:
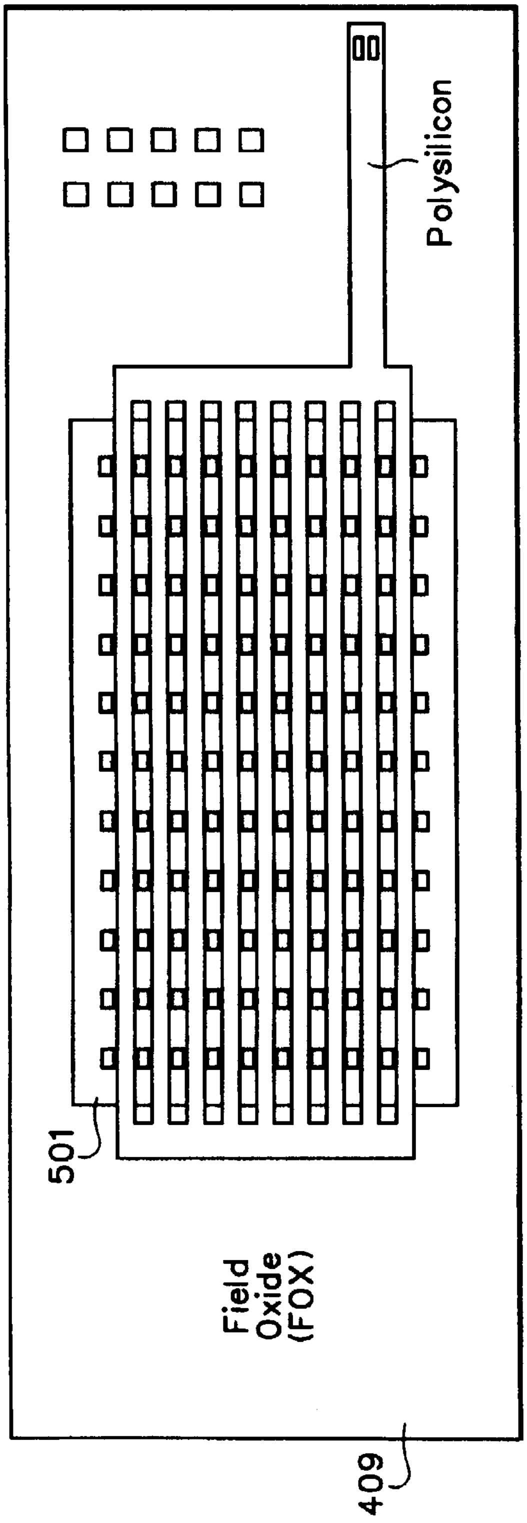
FIG. 7 is a top view representation, after the PSG contact and substrate contact and substrate contact etching as illustrated by FIG. 4P.

FIG. 7 is a top view, after the PSG contact and substrate contact and substrate contact etching.

Figure 4Q:
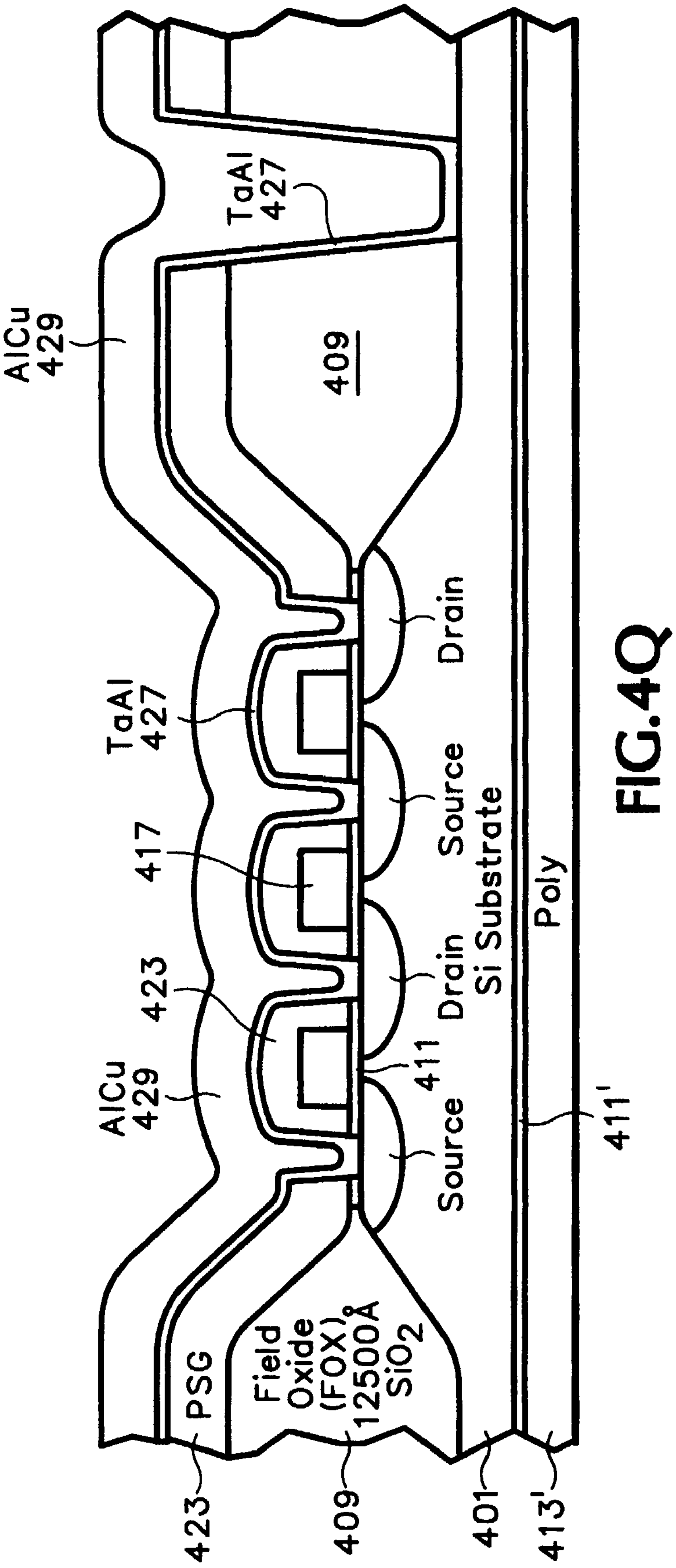

Next, as demonstrated by FIG. 4Q, the first metallization layers can now be deposited in a known manner. In the preferred embodiment, a tantalum/aluminum substrate-contacting metal 427 is deposited and an aluminum/copper metal 429 over-layer is deposited. The tantalum/aluminum substrate-contacting metal 427 also forms the individual heater/firing resistors. In the preferred embodiment, the Ta/Al 427 layer has a thickness of approximately 900 Å, and a range from approximately 800 Å to approximately 1000 Å can be employed; the Al/Cu 429 layer has a thickness of approximately 5000 Å, and a range from approximately 4000 Å to approximately 6000 Å can be employed. This stratified metallization is preferred because tantalum-aluminum has a high resistivity and is a relatively poor conductor of electricity. Its thermal coefficient of resistance ("TCR") is low and slightly negative. This keeps the resistance of the heater resistor almost constant even with high temperature excursions. It reaches operating temperatures very fast under an electric current, thus making it a good ink heater resistor material.

Figure 4R:
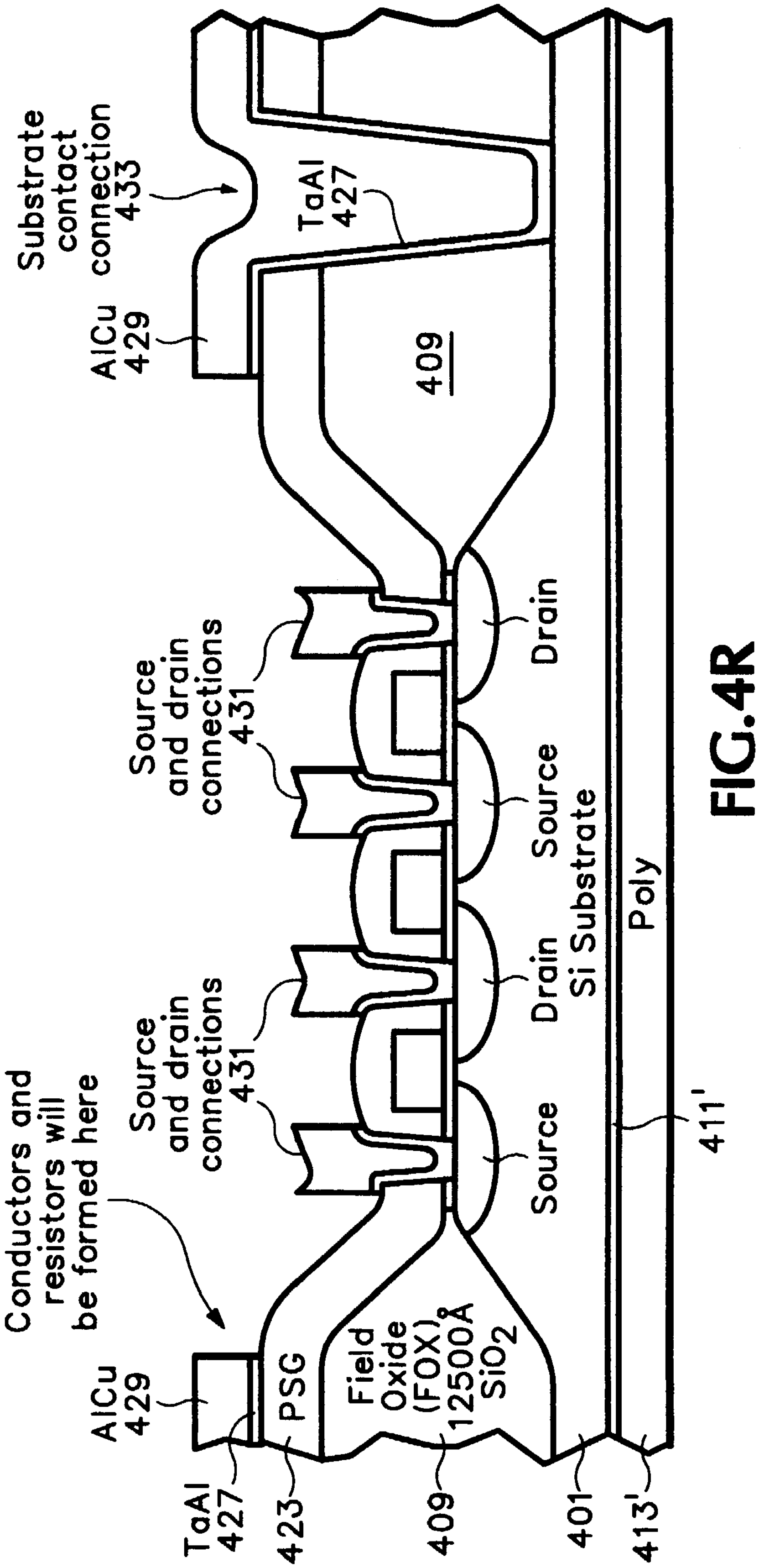
Figure 8:
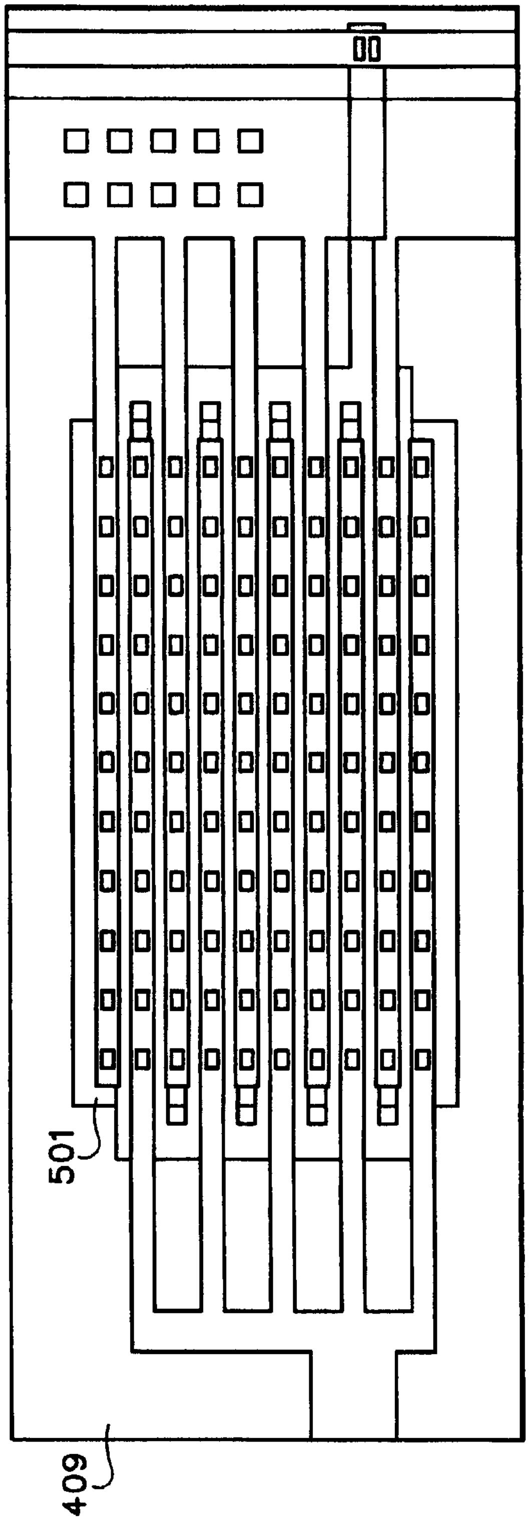
FIG. 8 is a top view of the structure after the first metallization deposition, patterning, and etching as illustrated by FIG. 4R.

FIG. 4R represents the structure after another photoresist mask, a "conductor mask," has been stripped following the etch of the first metallization layers 427, 429 to for trace conductors for resistors 207 (FIG. 2), connection electrodes 431 for the MOSFET source/drain regions of the substrate 401, and the substrate contact connection 433. FIG. 8 is a top view of the structure after the first metallization deposition, patterning, and etching.

Figure 2:
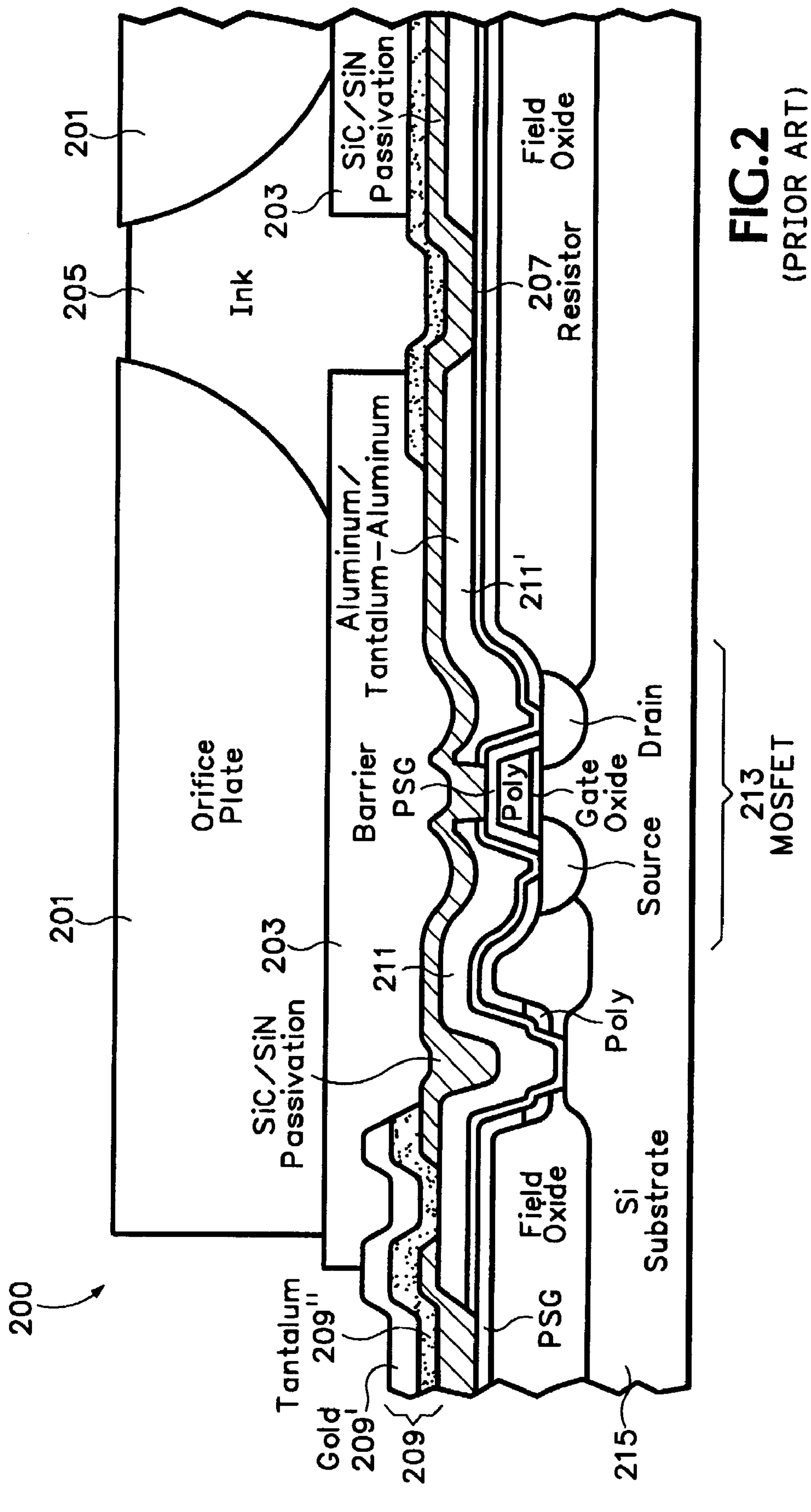
FIG. 2 (PRIOR ART) is a schematic illustration in a cross-section elevation view of a printhead structure of the pen as shown in FIG. 1.

The remaining steps of the process are known manner pattern and etch of the AL/Cu layer to expose the Ta/Al heater resistors, addition of passivation (preferably $Si_3N_4$ and silicon carbide, SiC), and masking to deposit and etch the tantalum gold traces 209 and bond pads for flex circuit connections as illustrated in FIG. 2. The structure is then ready for attachment to the orifice plate 201.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . " and no process step herein is to be construed under those provisions unless the step or steps are expressly recited using the phrase "comprising the step(s) of . . . ."

The invention claimed is:

1. A method for fabricating a fluid ejection device, comprising:

forming a device isolation layer on a substrate;

forming an insulating layer directly on the device isolation layer in a substrate contact area;

forming a polysilicon layer under the insulating layer near a source and drain, wherein the polysilicon layer is not formed between the insulating layer and the substrate at the substrate contact area;

forming at least one substrate contact in the substrate contact area that electrically grounds the substrate; and extending at least one substrate contact through the insulating layer and the device isolation layer to the substrate.

2. The method of claim 1, wherein at least one substrate contact includes a low conductivity layer contacting at least one of the substrate, device isolation layer and insulating layer and a high conductivity portion deposited on the low conductivity layer.

3. The method of claim 2, wherein the low conductivity layer contacting the substrate is tantalum-aluminum, and wherein the high conductivity layer is aluminum-copper.

4. The method of claim 2, wherein the device isolation layer is a field oxide layer.

5. The method of claim 1, wherein the insulating layer is phosphosilicate glass (PSG).

6. The method of claim 1, wherein the insulating layer acts as an under-layer for a heater/firing resistor in the fluid ejection device to expel out of a drop firing chamber ink accumulated from an ink supply.

* * * * *

UNITED STATES PATENT AND TRADEMARK OFFICE

CERTIFICATE OF CORRECTION

PATENT NO. : 7,037,736 B2
APPLICATION NO. : 10/436921
DATED : May 2, 2006
INVENTOR(S) : Victorio A. Chavarria et al.

It is certified that error appears in the above-identified patent and that said Letters Patent is hereby corrected as shown below:

In column 4, line 37, delete “41,” and insert -- 4I, --, therefor.

In column 4, line 46, delete “600D;” and insert -- 600Å; --, therefor.

In column 4, line 47, delete “500D” and insert -- 500Å --, therefor.

In column 4, line 47, delete “700D” and insert -- 700Å--, therefor.

Signed and Sealed this

Twenty-first Day of April, 2009

John Doll

JOHN DOLL
*Acting Director of the United States Patent and Trademark Office*